(12) United States Patent
Matsushita et al.

(10) Patent No.: US 7,957,447 B2
(45) Date of Patent: Jun. 7, 2011

(54) VCSEL ARRAY DEVICE AND METHOD FOR MANUFACTURING THE VCSEL ARRAY DEVICE

(75) Inventors: Kazuyuki Matsushita, Kanagawa (JP); Nobuaki Ueki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 108 days.

(21) Appl. No.: 12/189,564

(22) Filed: Aug. 11, 2008

(65) Prior Publication Data
US 2009/0129419 A1 May 21, 2009

(30) Foreign Application Priority Data

Nov. 20, 2007 (JP) .................................. 2007-300879
Mar. 17, 2008 (JP) .................................. 2008-067035

(51) Int. Cl.
*H01S 5/00* (2006.01)
(52) U.S. Cl. ........... 372/50.124; 372/50.12; 372/46.013; 372/46.01; 372/45.01
(58) Field of Classification Search ............. 372/50.124, 372/50.12, 46.013, 46.01, 45.01
See application file for complete search history.

(56) References Cited

U.S. PATENT DOCUMENTS

| 6,201,825 | B1 | 3/2001 | Sakurai et al. |
| 2004/0114653 | A1 | 6/2004 | Omori |
| 2004/0151221 | A1 | 8/2004 | Yamamoto et al. |
| 2004/0156410 | A1* | 8/2004 | DeBrabander et al. ......... 372/46 |
| 2005/0265671 | A1* | 12/2005 | Ono et al. ...................... 385/92 |
| 2006/0187997 | A1* | 8/2006 | Ezaki et al. ..................... 372/99 |
| 2007/0014323 | A1 | 1/2007 | Tachibana et al. |
| 2007/0121695 | A1* | 5/2007 | Miyamoto ............... 372/50.124 |

FOREIGN PATENT DOCUMENTS

| JP | 11-340565 | 12/1999 |
| JP | 2001-168282 | 6/2001 |
| JP | 2004-200210 | 7/2004 |
| JP | 2004-200211 | 7/2004 |
| JP | 2004-241777 | 8/2004 |
| JP | 2006-86498 | 3/2006 |
| JP | 2006-228892 | 8/2006 |
| JP | 2007-027260 | 2/2007 |
| JP | 2007-173513 | 7/2007 |

* cited by examiner

Primary Examiner — Kinam Park
(74) Attorney, Agent, or Firm — Fildes & Outland, P.C.

(57) ABSTRACT

Provided is a VCSEL array device that includes at least a first multilayer reflective film, an active layer, and a second multilayer reflective film, formed on a substrate that extends in a longitudinal direction. Plural mesa portions are formed on the substrate by selectively removing at least a portion of the first multilayer reflective film, active layer, and second multilayer reflective film. A selectively oxidized region is formed in at least one of the first multilayer reflective film and the second multilayer reflective film. The VCSEL array device further includes an interlayer insulating film that covers at least a side portion and a bottom portion of the mesa portions, and a surface protecting film that covers the interlayer insulating film. The surface protecting film has plural grooves formed along a longitudinal direction of the substrate in which at least a portion of the surface protecting film is removed.

11 Claims, 13 Drawing Sheets

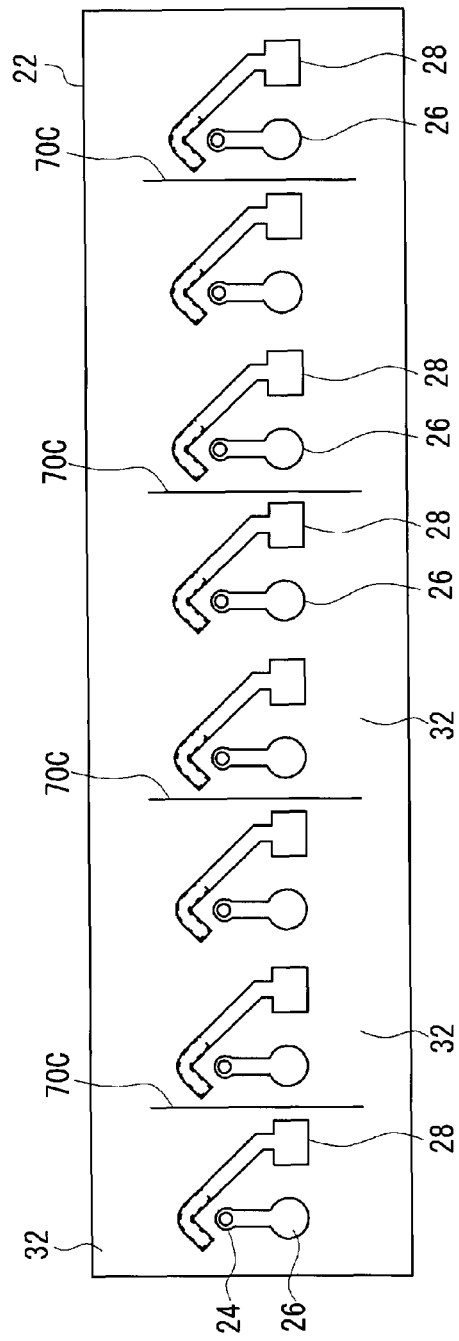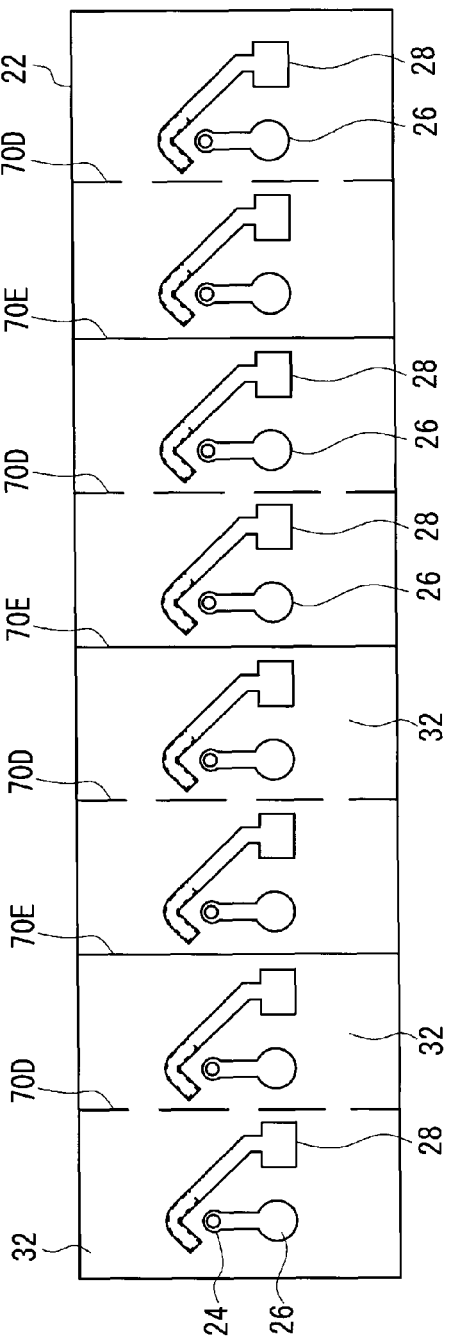

FIG. 16
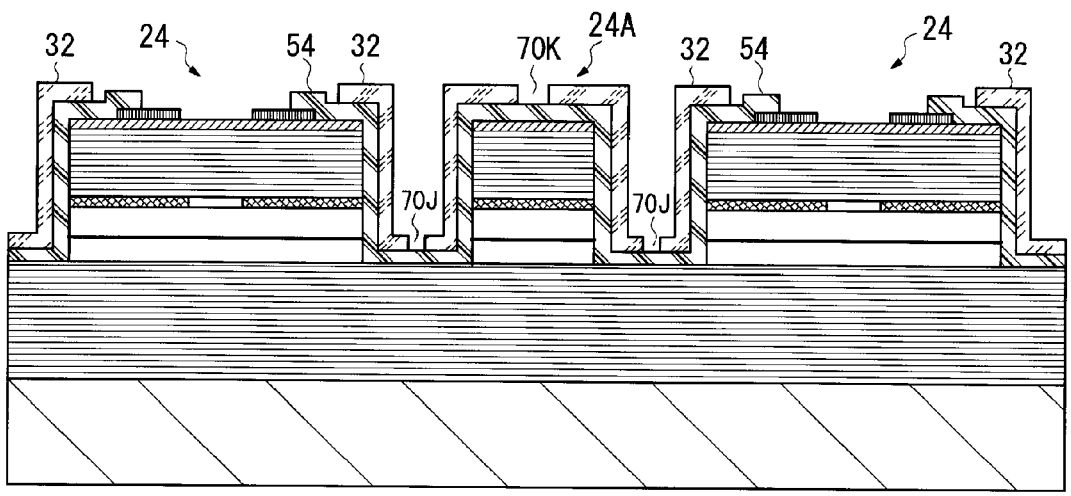
FIG. 17         Related Art
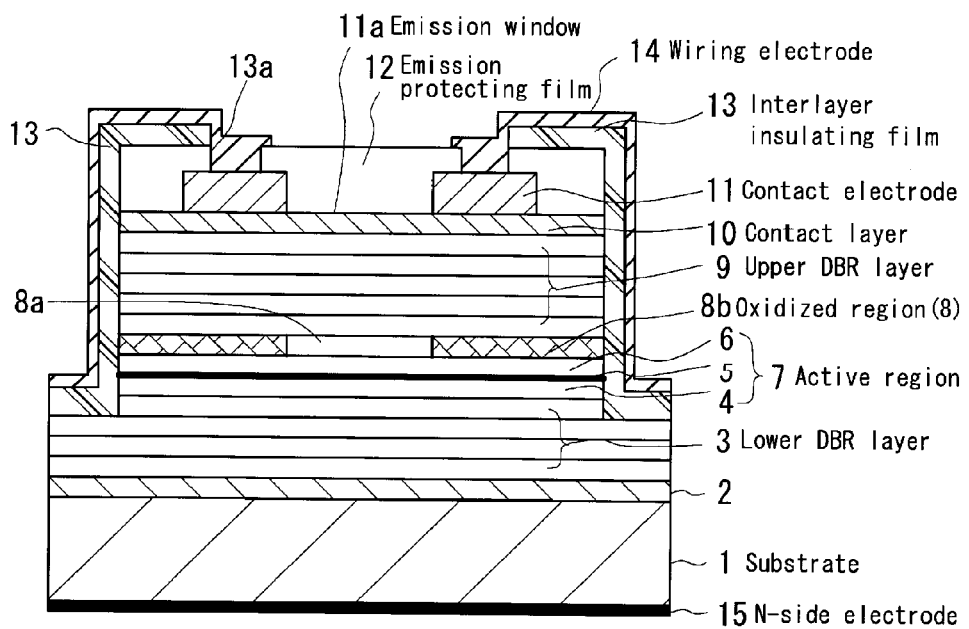

VCSEL ARRAY DEVICE AND METHOD FOR MANUFACTURING THE VCSEL ARRAY DEVICE

CROSS-REFERENCE TO RELATED APPLICATION

This application is based on and claims priority under 35 USC 119 from Japanese Patent Application No. 2008-67035 filed Mar. 17, 2008 and Japanese Patent Application No. 2007-300879 filed Nov. 20, 2007.

BACKGROUND

1. Technical Field

This invention relates to a surface light emitting semiconductor array device, and more specifically, to a stacked layered configuration of a Vertical-Cavity Surface-Emitting Laser diode (hereinafter referred to as VCSEL) array device. This invention also relates to a method for manufacturing the VCSEL array device.

2. Related Art

A VCSEL device is a type of laser diode that emits light from a surface of a semiconductor substrate. VCSELs have excellent characteristics, which edge-emitting type laser diodes do not have. For example, VCSELs require a lower current value for their driving (lower threshold current), and property tests can be performed while VCSELs are on a wafer (nondestructive evaluation), and VCSELs can be easily arranged in two-dimensional arrays. With these characteristics, VCSELs have been used as light sources for an optical data processor or an optical communication device, or a data storage apparatus using light.

FIG. 17 schematically illustrates a configuration of a selective oxidation type VCSEL device disclosed in JP-A-2004-200211. Formed on a substrate 1 are; n-type lower DBR layers 3: p-type upper DBR layers 9: active regions 7 disposed between the upper and lower DBR layers: and a current confining layer 8 that includes an oxidized region 8b being selectively oxidized. A contact layer 10, the upper DBR layers 9, and the current confining layer 8 form a mesa structure on the substrate. An edge portion of an upper surface and a side surface of the mesa structure, and a mesa bottom portion are covered with an interlayer insulating film 13. For the oxidation type VCSEL device disclosed in JP-A-2004-200211, the internal stress of the interlayer insulating film 13 is set to be equal to or less than $1.5 \times 10^9$ (dyne/cm$^2$) in order to prevent release of the mesa structure or the like and extend device life.

An issue of a selective oxidation type VCSEL device is so-called sudden failure. It has been thought that the cause of the sudden failure is that the composition in a stacked layered material alters due to oxidation, which causes dislocations (point defects) in a stacked film. The heat generated by laser oscillation enhances the movements of the dislocations and increases the dislocations, and the dislocations penetrate into an active layer and induce a sudden failure (device degradation). However, further studies have found that the dislocations do not occur simply due to the oxidation, but internal stresses occurred between an oxidized region and an interlayer insulating film formed near the oxidized region is a cause of the sudden failure.

A semiconductor layer that becomes a base of a VCSEL and an interlayer insulating film made of a dielectric film each has a different coefficient of thermal expansion, and thus it is inevitable that stress will occur as temperature rises. Such stress occurrence is especially noticeable in a long array device (that has plural light emitting points) in which stress is easily caused inherently due to warping of the substrate, and such stress occurrence has to be addressed.

An aim of the present invention is to provide a VCSEL device in which life degradation due to stress may be suppressed by controlling the stress that occurs in an interlayer insulating film, thereby the reliability of the device is improved, and provide a method for manufacturing a VCSEL device.

SUMMARY

An aspect of the present invention provides a VCSEL array device that includes at least a first multilayer reflective film, an active layer, and a second multilayer reflective film, formed on a substrate that extends in a longitudinal direction. Plural mesa portions are formed on the substrate by selectively removing at least a portion of the first multilayer reflective film, active layer, and second multilayer reflective film. A selectively oxidized region is formed in at least one of the first multilayer reflective film and the second multilayer reflective film. The VCSEL array device further includes an interlayer insulating film that covers at least a side portion and a bottom portion of the mesa portions, and a surface protecting film that covers the interlayer insulating film. The surface protecting film has plural grooves formed along a longitudinal direction of the substrate in which at least a portion of the surface protecting film is removed.

BRIEF DESCRIPTION OF THE DRAWINGS

Exemplary embodiments of the present invention will be described in detail based on the following figures, wherein:

FIGS. 12A and 12B are plan views illustrating a configuration a VCSEL array device according to a fifth example of the present invention in which mesa portions are linearly arranged;

FIG. 16 illustrates a cross section of an essential portion of an array device according to a ninth example of the present invention; and FIG. 17 illustrates a cross section of a configuration of a VCSEL device of a related art.

DETAILED DESCRIPTION

Referring to the accompanying drawings, examples of a selective oxidation type VCSEL array device according to an aspect of the present invention will be now described.

Figure 1:
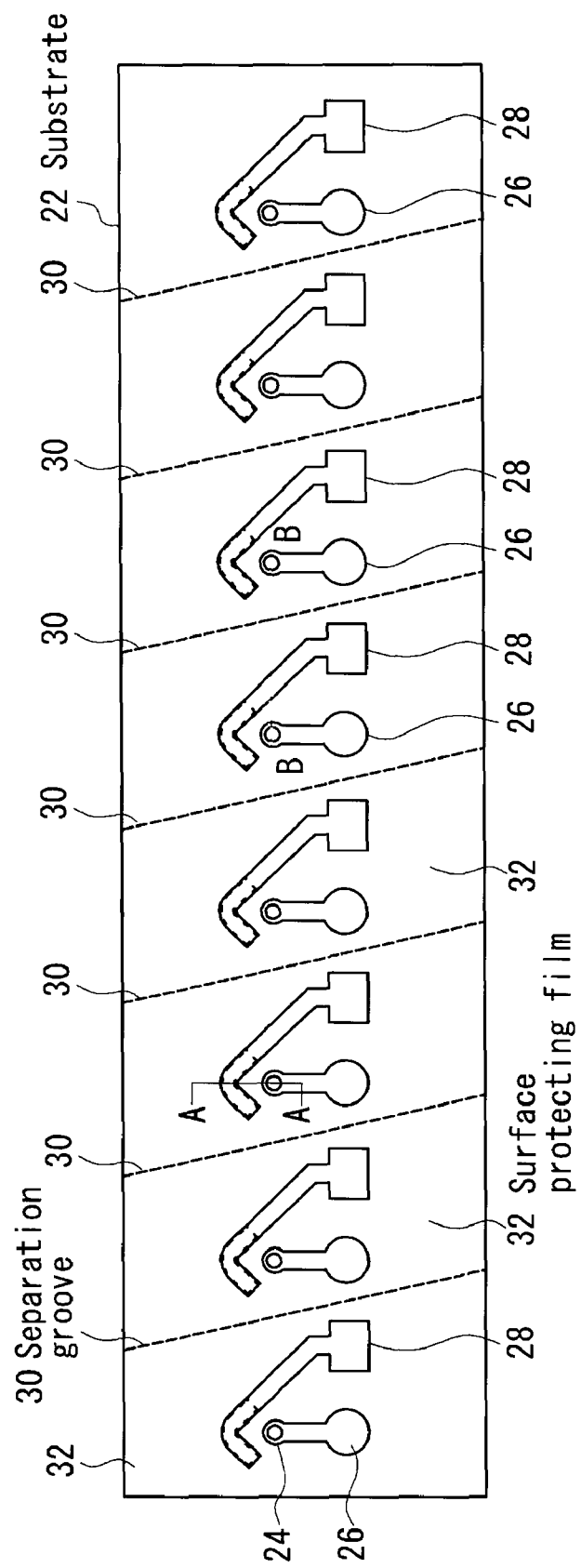
FIG. 1 is a plan view illustrating a configuration of a VCSEL device in which mesa portions are linearly arranged according to an example of the present invention.

FIG. 1 is a schematic plan view of an array device of a selective oxidation type VCSEL according to an example of the present invention. In an array device 20 shown in FIG. 1, plural mesa portions 24 (light emitting portions) are arranged linearly on an oblong rectangular substrate 22. On the substrate, eight mesa portions 24 may be formed at an approximate constant interval. On the substrate, plural p-side electrodes 26 and plural n-side electrodes 28 may be formed corresponding to the mesa portions 24. The p-side electrode 26 is electrically connected to a p-type contact layer at a top portion of the mesa portion 24. The n-side electrode 28 is electrically connected to an n-type semiconductor layer of the mesa portion 24. When a forward bias current is applied to the p-side electrode 26 and the n-side electrode 28, laser light is emitted from a top portion of corresponding mesa portion 24. In the example shown in FIG. 1, plural p-side electrodes 26 and plural n-side electrodes 28 are shown, however, in a case where all the mesa portions 24 are concurrently driven, the plural p-side electrodes 26 may be replaced with a common single electrode, and the plural n-side electrodes 28 may be replaced with a common single electrode.

On a surface of the substrate, a surface protecting film 32 for protecting the mesa portions 24 is formed. In this example, separation grooves 30 for separating each of the mesa portions is formed in the surface protecting film 32. Preferably, when n (n is a natural number equal to or greater than 2) mesa portions 24 are linearly arranged on the substrate, at least n−1 separation grooves 30 are formed for separating each of the mesa portions 24. However, the number of the separation grooves to be formed between one mesa portion and a mesa portion adjacent thereto may be either one or more than one. In the example of FIG. 1, seven separation grooves 30 are formed for the linearly arranged eight mesa portions.

Figure 2:
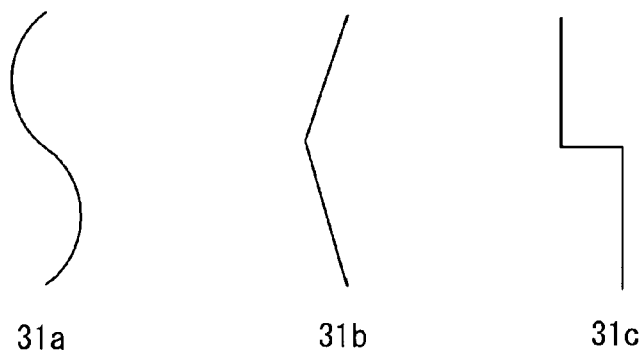
FIG. 2 illustrates other examples of separation grooves formed on the substrate.

The separation groove 30 may extend across the surface protecting film 32 and completely separate the surface protecting film 32 as shown in FIG. 1, or may partially separate the surface protecting film 32. The shape of the separation groove 30 may be linear; however, as shown in FIG. 2, the shape may be a curve 31a, a shape that includes a bent portion 31b, or a shape that includes an orthogonal portion 31c. In the example of FIG. 1, the separation grooves 30 extend linearly in parallel each other, having a constant angle with respect to a longitudinal direction of the substrate, and completely separate the surface protecting film 32.

Figure 3:
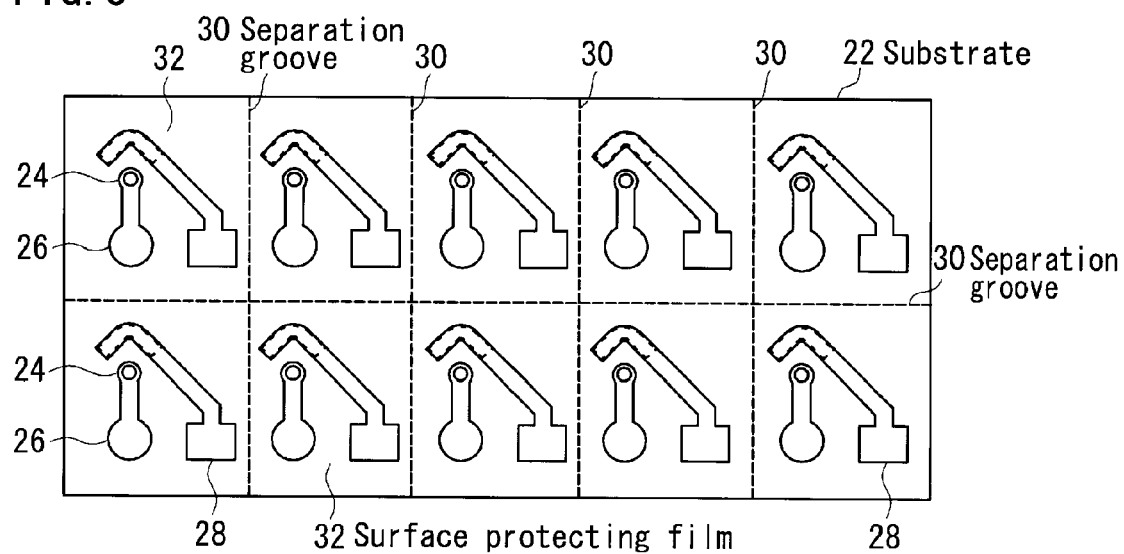
FIG. 3 is a plan view illustrating a configuration of a VCSEL device in which mesa portions are two-dimensionally arranged according to an example of the present invention.

FIG. 3 is a schematic plan view of an array device in which plural mesa portions (light emitting portions) are two-dimensionally arranged. The mesa portions 24 are arranged in an arrangement of 5 by 2 along a longitudinal direction of the rectangular substrate 22. The separation grooves 30 are formed for separating each of the mesa portions, four in a lengthwise direction, and one in a widthwise direction. Preferably, when the arrangement of the mesa portions 24 is n by m (n and m are natural numbers), the number of the separation grooves in a lengthwise direction is at least n−1, and the number of the separation grooves in a widthwise direction is at least m−1.

Figure 4A:
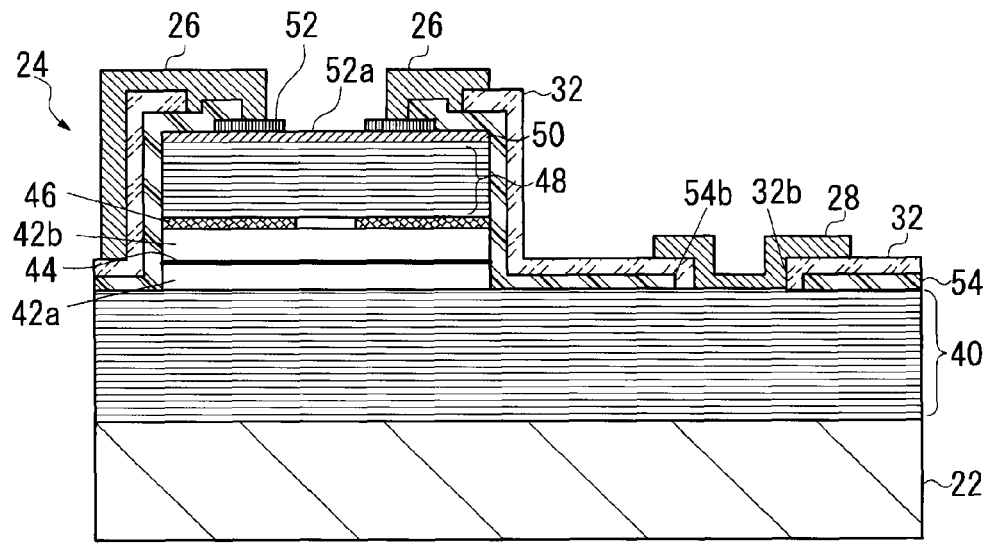
FIG. 4A illustrates a cross section of the VCSEL device shown in FIG. 1 taken along line A-A.
Figure 4B:
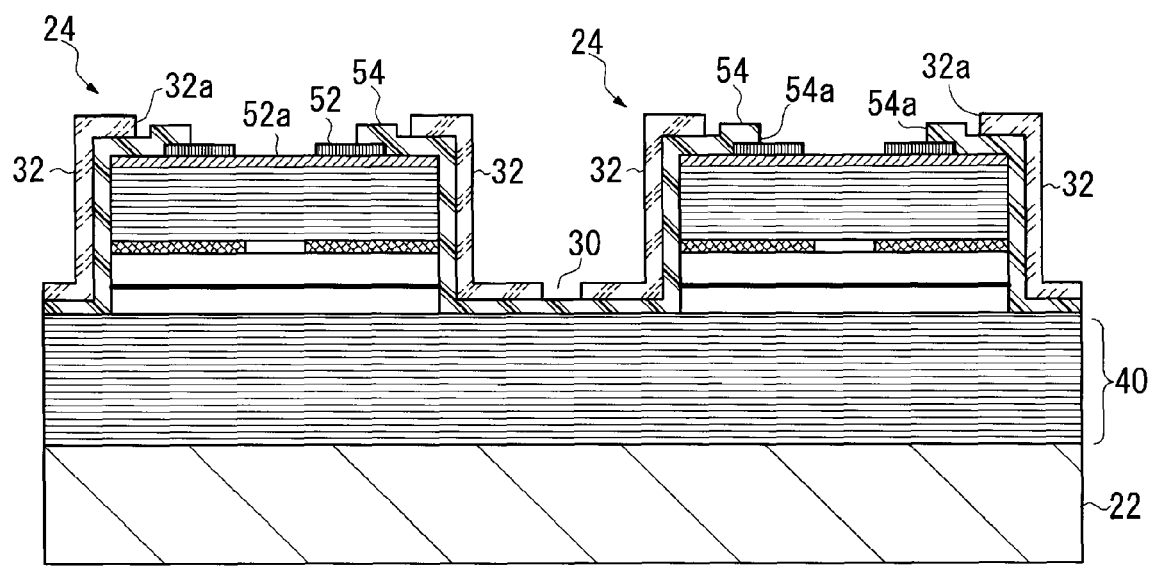
FIG. 4B illustrates a cross section of a VCSEL device shown in FIG. 1 taken along line B-B (excepting electrode)

A configuration of a VCSEL array device will be now described in detail. FIG. 4A is a cross sectional view of the VCSEL shown in FIG. 1 taken along line A-A. FIG. 4B is a cross sectional view of the VCSEL shown in FIG. 1 taken along line B-B. For the sake of convenience, the p-side electrode and the n-side electrode are omitted in FIG. 4B. In addition, the cross sectional views do not necessarily shown on the same scale as the plan view shown in FIG. 1.

On the semiconductor substrate 22 having a semi-insulating property, semiconductor thin films are stacked in an order described below; an n-type lower multilayer reflective mirror (hereinafter, lower DBR) 40, spacer layers 42 (layer nearer to the substrate is 42a, farther is 42b), a quantum well active layer 44, a p-type oxidation control layer 46, a p-type upper multilayer reflective mirror (hereinafter, upper DBR) 48. The lower DBR 40 and the upper multilayer reflective mirror 48 are distributed Bragg reflectors, and form a vertical resonator structure on the substrate. The spacer layers 42 are formed on both upper and lower sides of the substrate, sandwiching the quantum well active layer 44, and thus the layer nearer to the substrate is indicated as 42a, and farther as 42b. On an upper layer of the upper DBR 48, a p-type contact layer 50 is formed. In the contact layer 50, an annular contact electrode 52 is formed. An opening 52a in the contact electrode 52 becomes an emission window of laser light.

By etching the semiconductor thin films from the upper DBR 48 to the spacer layer 42 or to the lower DBR 40, a cylindrical mesa portion (or post) 24 is formed on the substrate 22. The periphery of a top portion, a sidewall, and a bottom portion of the mesa portion 24 is covered and protected with an interlayer insulating film 54. At a top portion of the mesa portion 24, a round-shaped contact hole 54a for exposing a portion of the contact electrode 52 is formed in the interlayer insulating film 54.

On the interlayer insulating film 54, the surface protecting film 32 is formed to cover the whole surface of the substrate. At a top portion of the mesa portion 24, a round-shaped contact hole 32a for exposing the contact hole 54a in the interlayer insulating film 54 is formed in the surface protecting film 32. The contact hole 32a has a slightly larger diameter than that of the contact hole 54a. In the surface protecting film 32, as shown in FIG. 1, the separation groove 30 for separating the mesa portion 24 from another mesa portion 24 is formed by etching. There is no limitation for shape, width or the like of the separation groove 30; however, a surface of the interlayer insulating film 54 is exposed by the separation groove 30.

As shown in FIG. 4A, at a top portion of the mesa portion 24, the p-side electrode 26 is connected to the contact electrode 52 exposed by the contact hole 32a in the surface protecting film 32 and the contact hole 54a in the interlayer insulating film 54. The n-side electrode 28 is electrically connected to the n-type lower DBR 40 exposed by the contact holes 54b and 32b respectively formed in the interlayer insulating film 54 and in the surface protecting film 32, at a bottom portion of the mesa portion 24.

In the VCSEL array device according to the example, the separation groove 30 for separating between the mesa portions is formed in the surface protecting film 32. Therefore, the stress that may otherwise propagate in the surface protecting film 32 to the inside of the device can be blocked, thereby the stress that occurs between an oxidized region 46a in the oxidation control layer 46 and the interlayer insulating film 54 can be reduced, and resulting degradation in long-term reliability of the VCSEL array device can be suppressed. Especially when any warping occurs on the substrate, for example, due to the difference in coefficient of thermal expansion between the substrate and the semiconductor thin films stacked thereon, stress tends to propagate through the surface protecting film 32; however, by the effect of the separation groove 30, the propagation of the stress can be suppressed.

Figure 5:
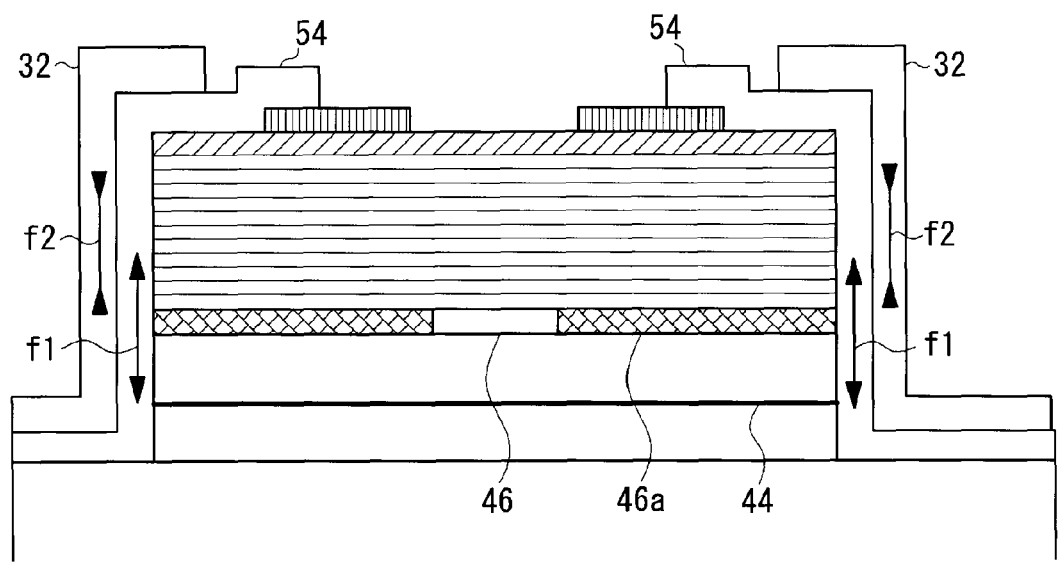
FIG. 5 illustrates the relation between a normal stress in an interlayer insulating film and a normal stress in a surface protecting film.

FIG. 5 illustrates the relation between a normal stress in the interlayer insulating film and a normal stress in the surface protecting film. When warping stress due to the oxidized region 46a in the oxidation control layer 46 near the active layer 44 causes a normal stress f1 in the interlayer insulating film 54 such that the film 54 is compressed normal to the mesa portion 24 as illustrated, it is preferable that the surface protecting film 32 is a film material having a normal stress f2 in an opposite direction to the normal stress f1. In contrast, if the normal stress f1 in the interlayer insulating film 54 has a direction such that the film 54 is stretched, it is preferable that the surface protecting film 32 is a film material having a normal stress f2 in a direction the film 32 is compressed. A preferable combination of materials, film thickness or the like of the interlayer insulating film 54 and the surface protecting film 32 may be selected to satisfy the relation described above. This enables that even if the stress from the interlayer insulating film 54 propagates in the surface protecting film 32, all or a portion of the normal stress f1 in the interlayer insulating film 54 may be cancelled, and the propagation of the stress into each layer in the mesa portion 24 can be reduced.

Figure 6A:
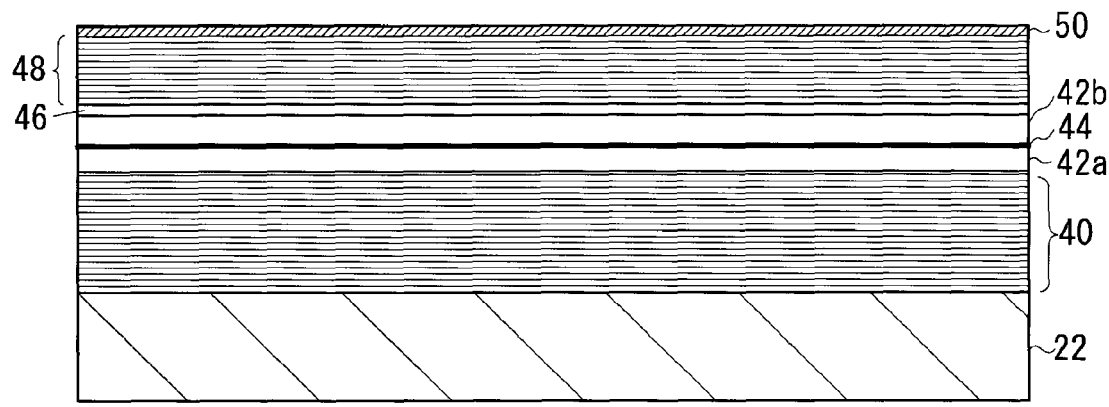
FIGS. 6A to 6C are cross sectional views illustrating a process for manufacturing a VCSEL array device according to an example of the present invention.

Referring now to FIGS. 6A to 7C, a method for manufacturing a VCSEL array device will be described. FIGS. 6A to 7C correspond to the portion shown in FIG. 4B. As shown in FIG. 6A, the n-type lower multilayer reflective mirror (DBR) 40 may be formed on the GaAs substrate 12 by alternately stacking plural periods (pairs) of $Al_{0.9}Ga_{0.1}As$ layer and $Al_{0.3}Ga_{0.7}As$ layer, for example, wherein the thickness of each layer is $\lambda/4n_r$ (where $\lambda$ is lasing wavelength, $n_r$ is refractive index of the medium). The spacer layers 42 (42a, 42b) may be made of an undoped $Al_{0.5}Ga_{0.5}As$, for example, and the quantum well active layer 44 may be made of an undoped GaAs quantum well layer and an undoped $Al_{0.2}Ga_{0.8}As$ barrier layer, for example. The combined thickness of the spacer layers 42 and the quantum well active layer 44 is $\lambda/n_r$. The p-type upper multilayer reflective mirror (DBR) 48 may be formed by alternately stacking plural periods of $Al_{0.9}Ga_{0.1}As$ layer and $Al_{0.3}Ga_{0.7}As$ layer, for example, wherein the thickness of each layer is ¼ of the wavelength in the medium, as in the case of the lower multilayer reflective mirror 40. Formed below the DBR 48 is the p-type AlAs layer (oxidation control layer) 46, and formed on the DBR 48 is the p-type GaAs contact layer 50 having a higher carrier concentration, for example, and these layers 46 and 50 also configure a portion of the reflective mirror.

Figure 6B:
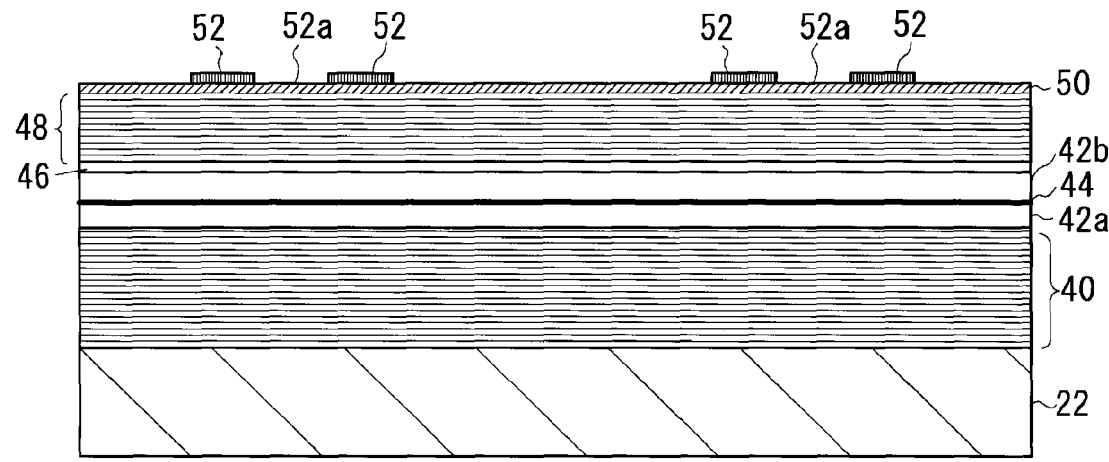

As shown in FIG. 6B, the annular contact electrode 52 is formed at a top portion of the contact layer 50. The contact electrode 52 may be formed of two layers of Ti/Au, for example. The electrode 52 has an annular shape, because it acts an opening from which laser light is emitted.

Figure 6C:
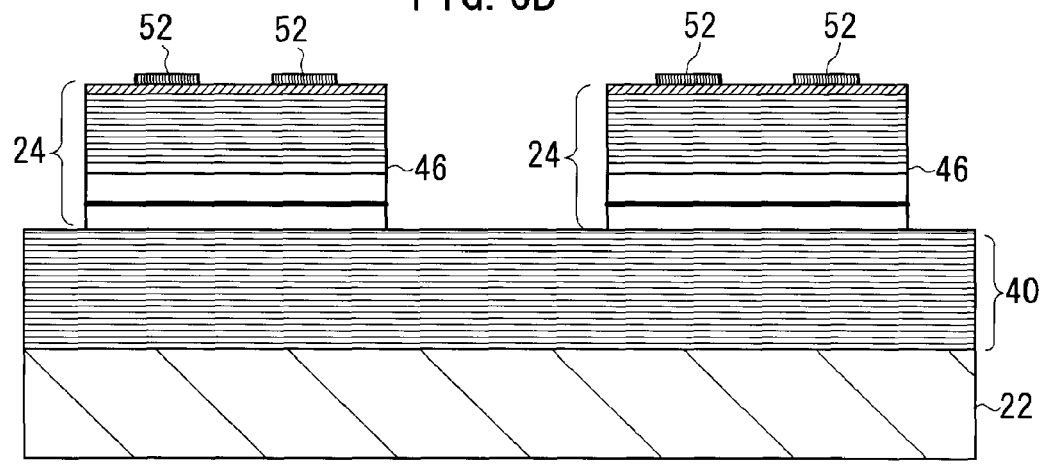

By using a photolithography process, a predetermined mask pattern is formed on the substrate. Then, as shown in FIG. 6C, semiconductor layers may be etched by a reactive ion etching from the upper multilayer reflective mirror 48 to the spacer layer 42a or to a portion of the lower multilayer reflective mirror 40, to form plural cylindrical or rectangular mesa portions (posts) 24. In this example, two cylindrical mesa portions 24 are shown.

Figure 7A:
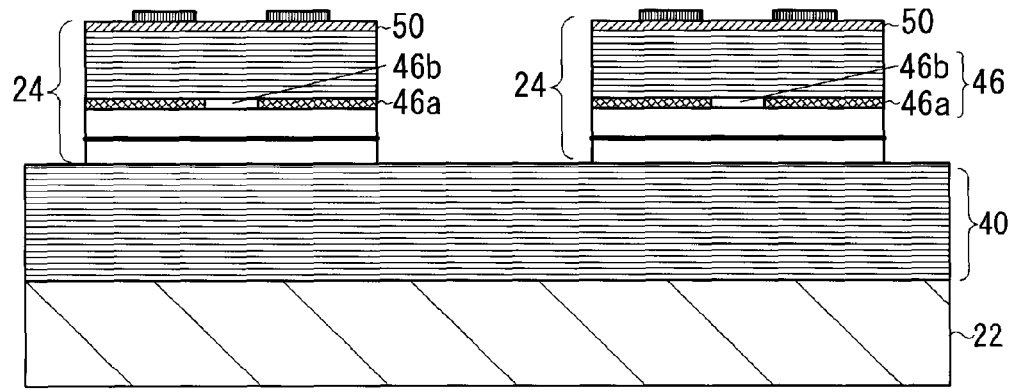
FIGS. 7A to 7C are cross sectional views illustrating a process for manufacturing a VCSEL array device according to an example of the present invention.

The substrate is thermally processed under a vapor atmosphere at a high temperature to form the oxidized region 46a surrounding the oxidation control layer (AlAs layer) 46 in the mesa portions 24, as shown in FIG. 7A. By this thermal processing, a current confining layer 46b that also acts as a light confining region is formed at an inner portion of the oxidation control layer 46.

Figure 7B:
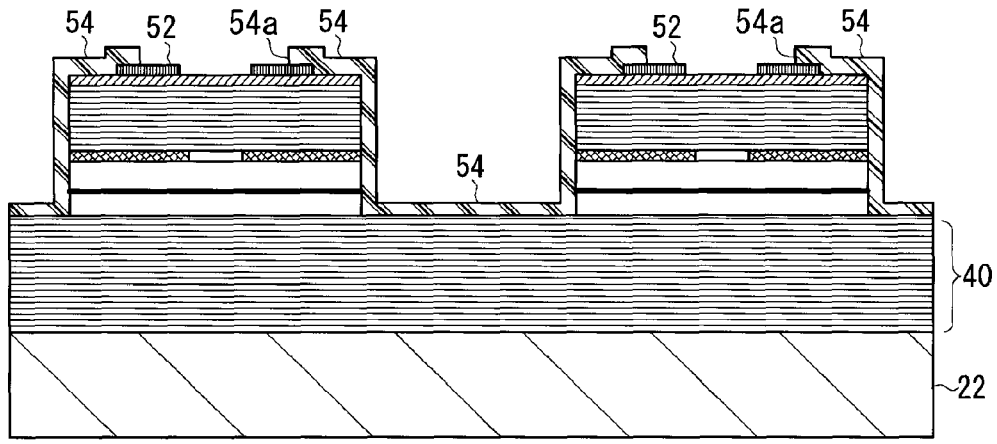

As shown in FIG. 7B, the interlayer insulating film 54 is formed on the whole surface of the substrate. The contact hole 54a, in which only an inner portion of the contact electrode 52 is removed, is formed at a top portion of the mesa portion 24. The etching of the interlayer insulating film 54 may be performed by using a mask pattern formed by a known photolithography process. For the material of the interlayer insulating film 54, an inorganic insulating film of such as aluminum nitride (AlN), alumina ($Al_2O_3$), silicon nitride ($SiN_x$) or the like may be used. Especially, an insulating material containing aluminum has a high thermal conductivity, and is preferable for the material of the interlayer insulating film. The interlayer insulating film 54 may be a single layer of AlN, or may be stacked layered films in which inorganic insulating films of $Al_2O_3$, $SiN_x$ or the like are combined.

Figure 7C:
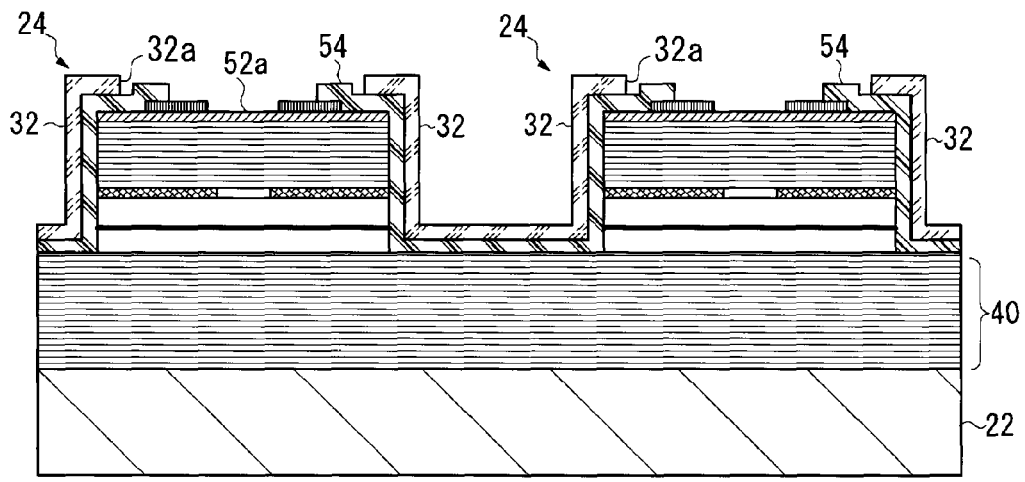

As shown in FIG. 7C, the surface protecting film 32 whose stress (normal stress f2) has an opposite direction to the direction of the normal stress f1 in the interlayer insulating film 54 is formed on the interlayer insulating film 54 and on the whole surface of the substrate. At a top portion of the mesa portion 24, the surface protecting film 32 is etched such that the contact hole 32a being greater than the contact hole 54a in the interlayer insulating film 54 is formed. Concurrently with the formation of the contact hole 32a, as shown in FIG. 4B, the separation groove 30 for separating each of the mesa portions 24 may be formed in the surface protecting film 32 by etching. The etching of the surface protecting film 32 may be performed by using a mask pattern formed by a known photolithography process.

For the material of the surface protecting film 32, silicon nitride ($SiN_x$), silicon dioxide ($SiO_2$), silicon oxynitride (SiON) or the like may be used. For example, if a single layer or stacked layered films of AlN or $Al_2O_3$ is used for the interlayer insulating film 54, it is desirable to use silicon nitride ($SiN_x$) for the surface protecting film 32 because of the relation between normal stresses. If silicon nitride ($SiN_x$) is used for the interlayer insulating film 54, it is desirable to use silicon dioxide ($SiO_2$) or silicon oxynitride (SiON) for the film 32.

Figure 8A:
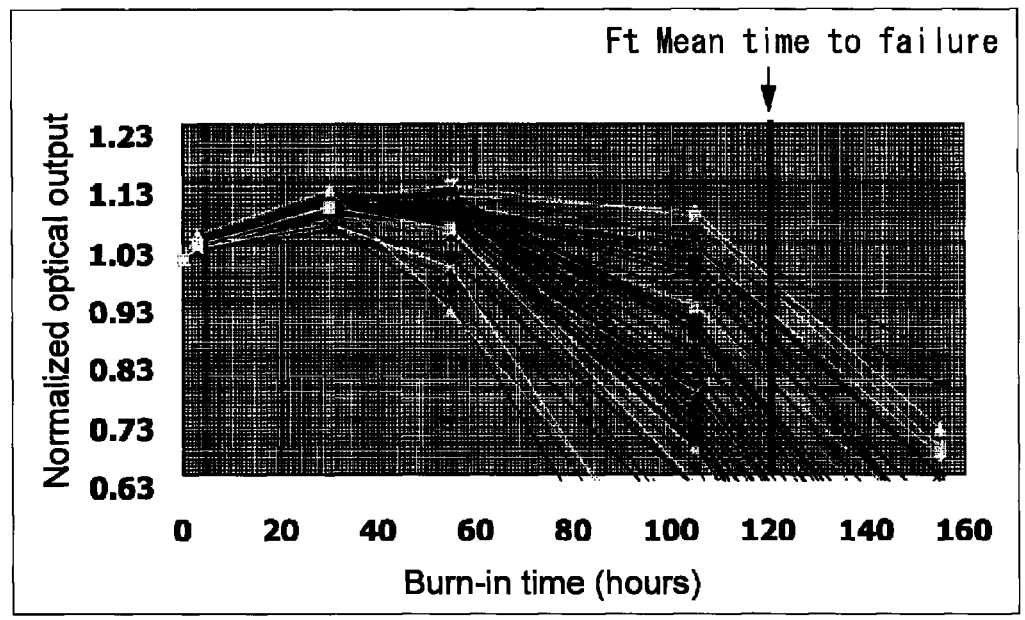
FIGS. 8A and 8B are graphs illustrating results of a high-temperature burn-in test, comparing a VCSEL array device according to an example of the present invention with a VCSEL array device of a related art.
Figure 8B:
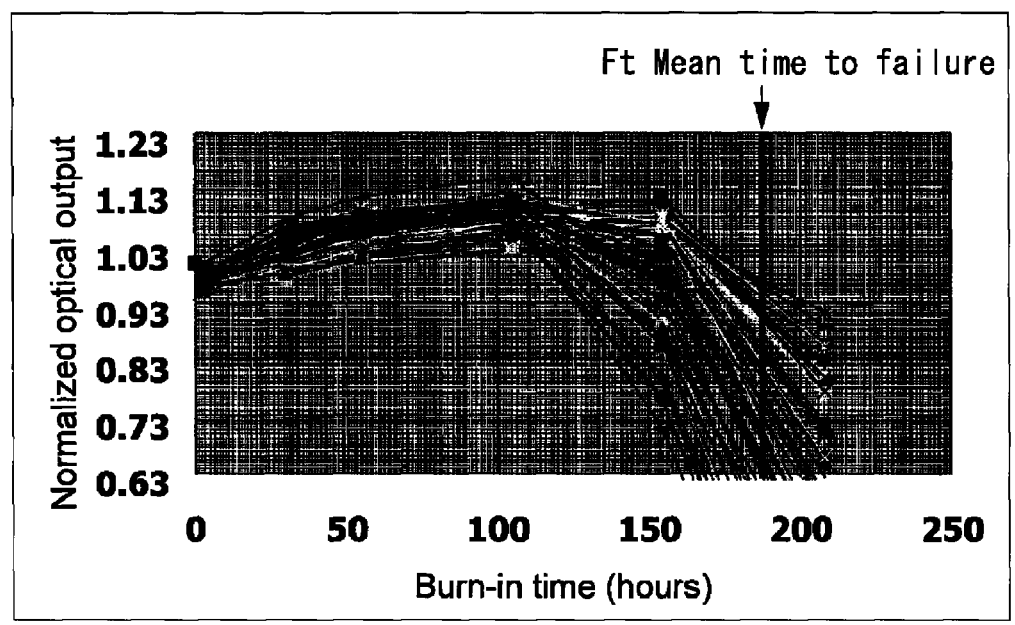

FIGS. 8A and 8B illustrate examples for comparing the reliability of a VCSEL array device according to an example with that of a related art, under a high-temperature burn-in test. In this disclosure, a point where the optical output decreases by 2 dB (about 37% down) when a constant current is injected is defined as a failure, and the duration until half of the devices under the test is subjected to failure is defined as mean time to failure Ft. FIG. 8A illustrates results for the mean time to failure Ft obtained by a configuration of a related art in which the surface protecting film 32 is formed continuously and there is no separation groove. FIG. 8B illustrates results obtained by a VCSEL array device according to an example in which the separation grooves 30 are formed for separating the surface protecting film 32 between each of the mesa portions 24. As obvious from these graphs, the mean time to failure Ft of the VCSEL array device having the configuration of the related art is about 120 hours, while the mean time to failure Ft of the VCSEL array device of the example is about 180 hours, and it can be seen that the mean time to failure of the VCSEL array device according to the example is increased by about 50%, and the reliability of the device is improved.

In addition, AlN, $Al_2O_3$ or the like used for the interlayer insulating film 54 has a high thermal conductivity and a good heat dissipation property, and thus the heat emitted together with light from the quantum well active layer 44 can be efficiently released outside through the interlayer insulating film 54. This improves properties of the VCSEL device at a high temperature, and the maximum oscillation temperature is improved by 20%, from 100 degrees centigrade to 120 degrees centigrade (not shown). As a result, stable operation can be maintained even in operating at a high temperature.

A second example of the present invention will be now described. In the first example, the separation groove is formed only in the surface protecting film, while in the second example, a separation groove is formed in a surface protecting film and an interlayer insulating film below thereof.

Figure 9:
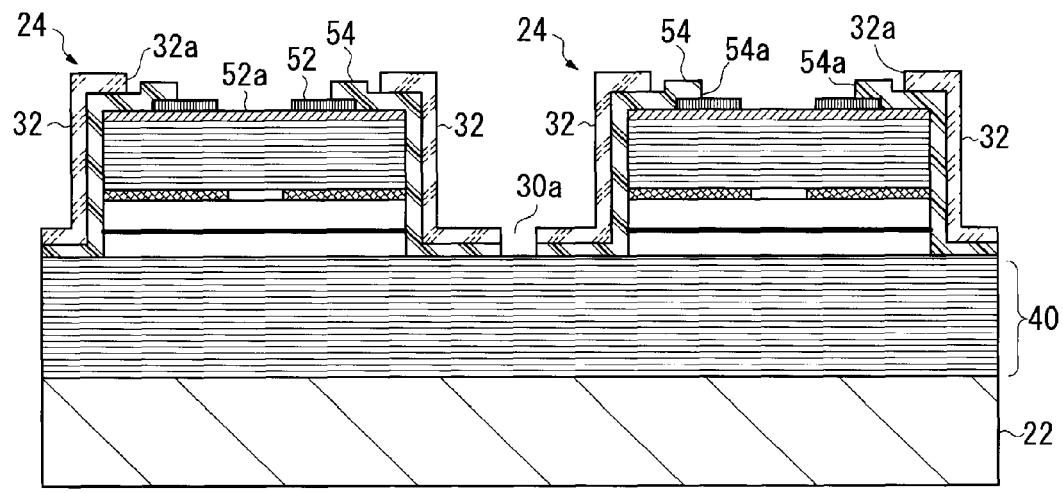
FIG. 9 illustrates a cross section of an essential portion of a VCSEL array device according to a second example of the present invention.

FIG. 9 illustrates a cross section of an essential portion of a VCSEL array device according to a second example. Same reference numerals are used for a similar configuration to that of FIG. 4B. As shown in FIG. 9, a separation groove 30a of the second example penetrates through the surface protecting film 32 and also the interlayer insulating film 54, and reaches a surface of the semiconductor. As described above, an aim of the present invention is to relieve stress or suppress the occurrence of the stress by providing the surface protecting film 32 having a normal stress in an opposite direction to the normal stress in the interlayer insulating film 54. However, it is difficult to completely eliminate the stress, and thus it is expected that the stress may propagate in the interlayer insulating film 54. Therefore, by cutting the film 54 or forming a slit in the film 54 similarly to the surface protecting film 32, the propagation of the stress in the interlayer insulating film 54 may be blocked, which improves long-term reliability.

Figure 10:
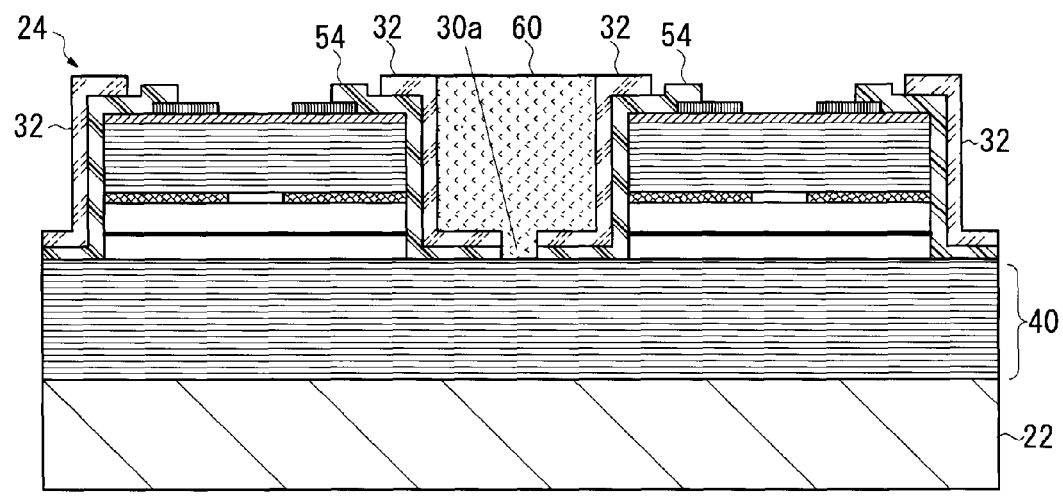
FIG. 10 illustrates a cross section of an essential portion of a VCSEL array device according to a third example of the present invention.

A third example of the present invention will be now described. In the second example, a portion of the interlayer insulating film 54 is removed by the separation groove 30a; however, if the semiconductor surface exposed by the removal of the interlayer insulating film 54 is exposed to the atmosphere, the exposure may cause oxidation or corrosion. To avoid such a disadvantage, in the third example, as shown in FIG. 10, the space between the mesa portions including the separation groove 30a may be filled with a resin 60 of polyimide or the like. Polyimide being an organic polymer and including an imide bond has a high elasticity as compared with an inorganic insulating film, and stress rarely occurs between the resin 60 and the surface protecting film 32 that comes in contact with the resin 60. Furthermore, polyimide does not mediate stress propagation, and has less adverse effect on long-term reliability due to stress. However, it should be noted that polyimide has a low thermal conductivity and has moisture absorbency, and thus there may be another concern in the use under an environment at a high temperature and high humidity.

Fourth to ninth examples of the present invention will be described, in which same reference numerals have been retained for similar configurations to those of the first to third examples.

Figure 11A:
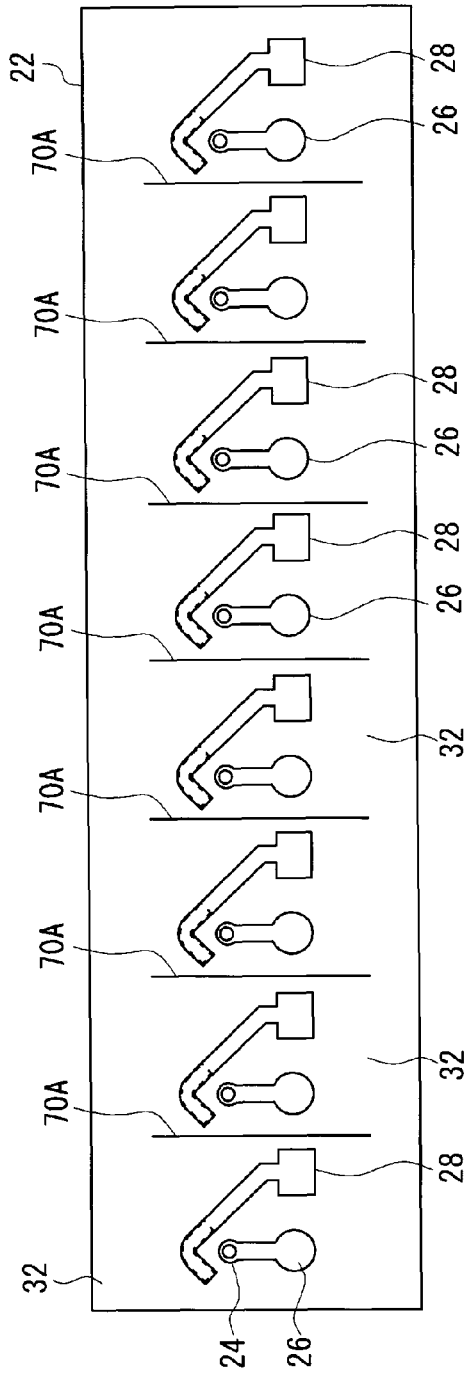
FIGS. 11A and 11B are plan views illustrating a configuration of a VCSEL device according to a fourth example of the present invention in which mesa portions are linearly arranged.
Figure 11B:
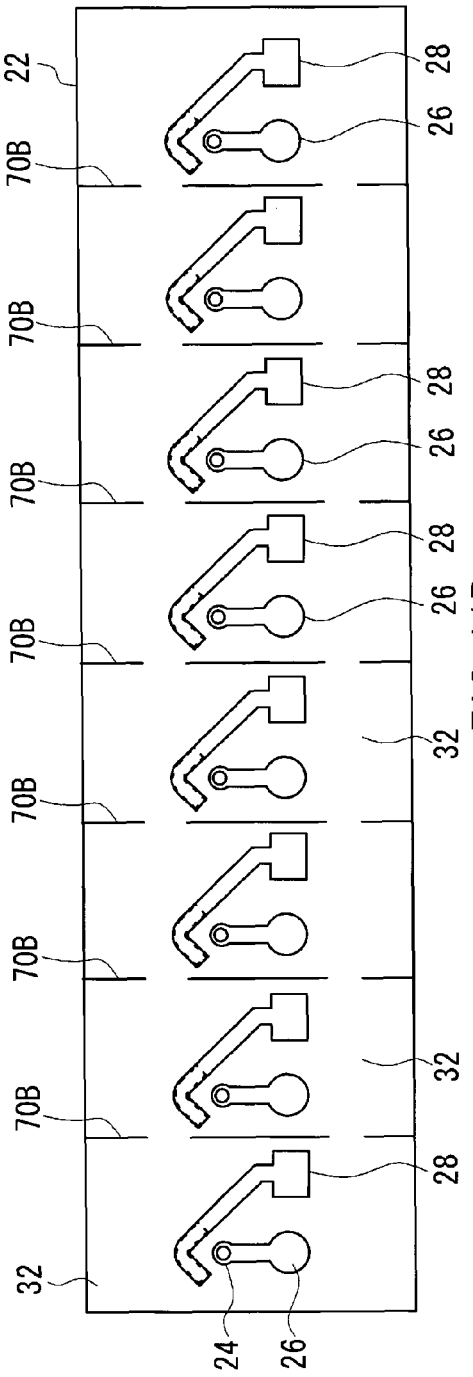

FIGS. 11A and 11B illustrate plan views of a VCSEL array device according to a fourth example of the present invention. In the fourth example, as shown in FIG. 11A, plural grooves 70A are formed along a longitudinal direction of the substrate 22 on which array devices are formed. The grooves 70A do not completely separate the surface protecting film 32. In other words, each of the grooves 70A is a slit having a constant length and partitioning the substrate 22 orthogonally to the longitudinal direction of the substrate 22. The surface protecting film 32 remains unseparated at both edge portions of the width of the substrate 22. The grooves 70A having such a configuration relieve the stress in the interlayer insulating film similarly to the first to third examples, and also reduce the region exposed by the grooves 70A. Therefore, moisture or water does not easily enter from outside, and moisture resistance and water resistance can be improved.

FIG. 11B is a modification of the fourth example. In this example, each of grooves 70B formed between the mesa portions is not a single slit, but has plural slits. In the example in FIG. 11B, each of the grooves 70B has three slits lying across the substrate 22, and the three slits are disposed between the mesa portions located in a longitudinal direction of the substrate. The region exposed by the grooves 70B is further reduced, and thus moisture resistance and water resistance of the array device can be improved.

FIGS. 12A and 12B illustrate plan views of a VCSEL array device according to a fifth example of the present invention. In the first example, n–1 separation grooves are formed when the number of the mesas is n; however, in the fifth example, the number of the grooves is not limited to n–1, and a less number of grooves may be formed. In the example shown in FIG. 12A, grooves 70C are formed between every two mesa portions, excepting the mesa portions locating at the rightmost and leftmost. This is only exemplary, and, for example, in a case where the number of the mesa portions formed in a longitudinal direction of the substrate 22 is quite many, the grooves may be formed at intervals of every three or greater than three mesa portions. In addition, the pattern of the grooves is not necessarily limited to one type; but plural patterns may be formed. For example, as shown in FIG. 12B, grooves 70D each having plural slits are formed between every two mesa portions, and linear grooves 70E are formed between every two mesa portions, and each of the grooves 70D and grooves 70E are alternately arranged in a longitudinal direction of the substrate 22. By reducing the number of the grooves for the number of the mesa portions, the region exposed by the grooves may be reduced, and thus moisture resistance and water resistance can be improved. The stress in the interlayer insulating film is also relieved by the grooves.

Figure 13A:
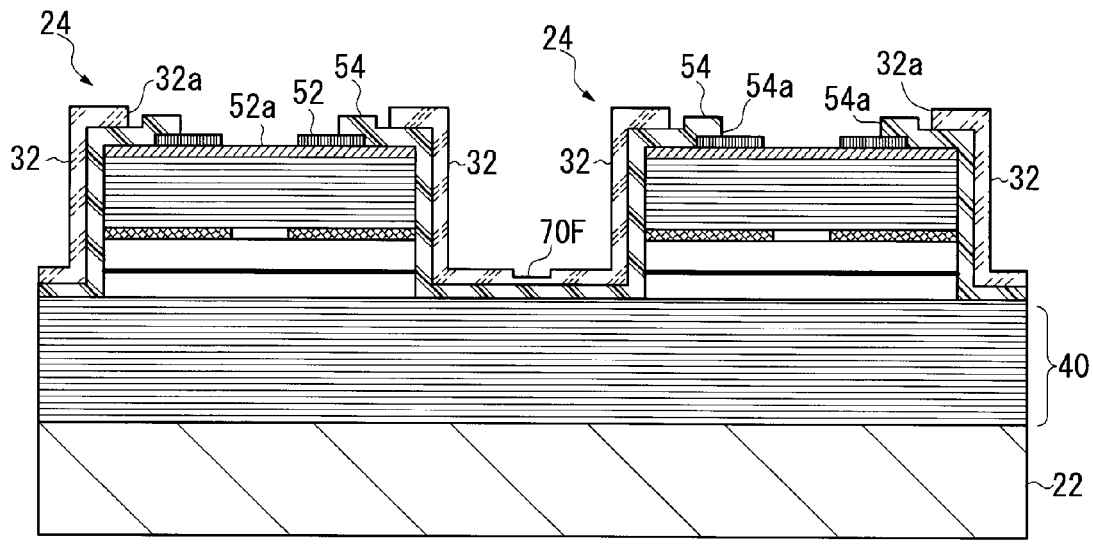
FIGS. 13A and 13B illustrate cross sections of an essential portion of an array device according to a sixth example of the present invention.
Figure 13B:
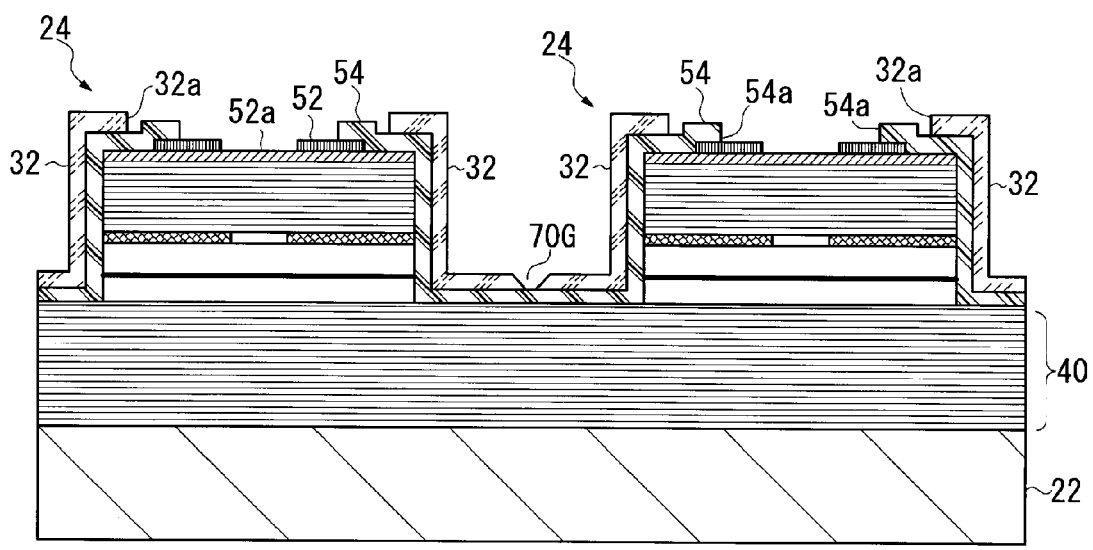

FIGS. 13A and 13B illustrate cross sections of an essential portion of a VCSEL array according to a sixth example of the present invention. In the sixth example, a groove 70F formed at a certain depth in the surface protecting film 32 does not completely separate the surface protecting film 32. The groove 70F having a desired depth can be obtained, for example, by adjusting the time of etching. The groove 70F does not expose the underlying interlayer insulating film 54, and thus moisture or water penetration from the groove 70F into the interlayer insulating film 54 may be suppressed, and moisture resistance and water resistance of the array device can be improved.

As in a groove 70G shown in FIG. 13B, the cross sectional shape of the groove may be made in a tapered shape. The tapered shape may be formed by an isotropic wet etching, for example. As compared with the groove 70F having an acute step shown in FIG. 13A, the groove 70G has a sloped step, and thus stress concentration at the step may be relieved. In addition, the adhesion of the surface protecting film 32 to the interlayer insulating film 54 may also be improved. Another advantage is that, in a case where the groove 70G is filed with a filling resin as shown in FIG. 10, void occurrence in the groove 70G may be avoided because the groove is sloped.

Figure 14:
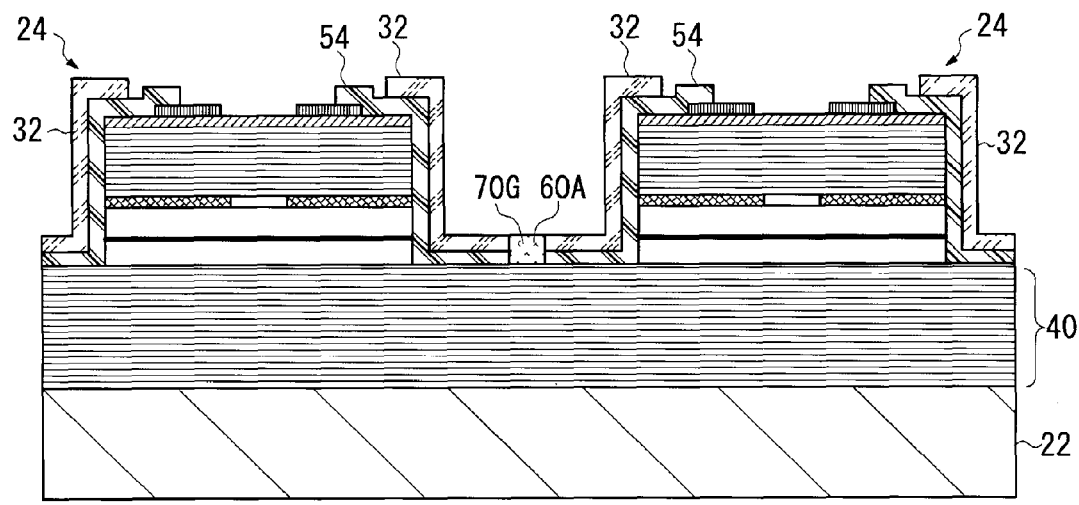
FIG. 14 illustrates a cross section of an essential portion of an array device according to a seventh example of the present invention.

FIG. 14 illustrates a cross section of an essential portion of a VCSEL array according to a seventh example of the present invention. The seventh example is a modification of the third example shown in FIG. 10. In the seventh example, the groove 70G formed in the surface protecting film 32 and the interlayer insulating film 54 is filled with a filling resin 60A; however, not all the space between the mesa portions is filled. By limiting the amount of the filling resin 60A, thermal stress can be reduced otherwise the resin 60A may cause near the oxidation control layer in the mesa portion.

Figure 15:
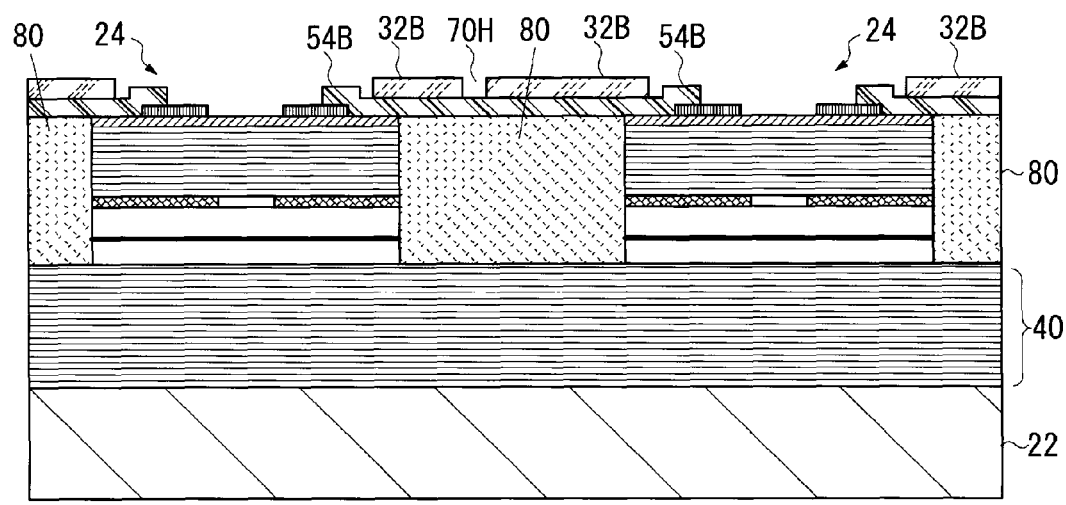
FIG. 15 illustrates a cross section of an essential portion of an array device according to an eighth example of the present invention.

FIG. 15 illustrates a cross section of an essential portion of a VCSEL array according to an eighth example of the present invention. In the eighth example, the space between the mesa portions is filled with an insulating material 80 of polyimide or the like, and the area between the mesa portions 24 is planarized. An interlayer insulating film 54B and a surface protecting film 32B are formed on the planarized insulating material 80, and a groove 70H is formed in the surface protecting film 32B. By planarizing the area between the mesa portions, the interlayer insulating film 54B and the surface protecting film 32B can be easily formed, and the film thickness of these films can be made thinner.

FIG. 16 illustrates a cross section of an essential portion of a VCSEL array according to a ninth example of the present invention. FIG. 16 corresponds to the cross section of FIG. 1 taken along line B-B. The ninth example differs from the first example (see FIG. 4B), and an in-between mesa portion 24A is formed between the light-emitting mesa portions 24. The in-between mesa portion 24A has a same semiconductor stacked layered configuration as the mesa portions 24, and an electrode layer is wired to a top portion of the mesa portion 24A. In such an array device configuration, grooves 70J are formed in the surface protecting film 32 at a bottom portion of the mesa portions, and a groove 70K is formed in the surface protecting film 32 at a top portion of the mesa of the in-between mesa portion 24A. The grooves 70J are located in proximity to the mesa portions 24, and thus the stress in the interlayer insulating film 54 can be effectively relieved. In addition, the groove 70K is located away from the mesa portions 24, and thus the path of the moisture or water penetrating therefrom into the mesa portions 24 becomes longer. This is effective in improving moisture resistance and water resistance of the mesa portions 24. The both of groove 70J and 70K are not formed necessarily, either the groove 70J or the groove 70K may be formed.

As described above, in a VCSEL array device according to the examples described above, the formation of a surface protecting film and the formation of a groove or a separation groove may relieve the stress in an interlayer insulating film, thereby the reliability of the device can be improved. The number, shape or the like of the groove or separation groove can be changed as appropriate in accordance with purpose or use. In addition, it is also possible to combine each of the examples from the first to the ninth examples described above.

The foregoing description of the examples has been provided for the purposes of illustration and description, and it is not intended to limit the scope of the invention. It should be understood that the invention may be implemented by other methods within the scope of the invention that satisfies requirements of a configuration of the present invention.

According to an aspect of the present invention, a VCSEL array device may be applied to a light emitting device such as an LED or a laser diode in which arrays may be arranged one-dimensionally or two-dimensionally on a substrate, and can be used as a light source for optical transmission, optical storage or the like.

What is claimed is:

1. A Vertical-Cavity Surface-Emitting Laser diode (VCSEL) array device, comprising:
    a substrate extending in a longitudinal direction,
    at least a first multilayer reflective film, an active layer, and a second multilayer reflective film, formed on the substrate,
    a plurality of mesa portions formed on the substrate by selectively removing at least a portion of the first multilayer reflective film, the active layer, and the second multilayer reflective film and arranged in a predetermined direction,
    a selectively oxidized region formed in at least one of the first multilayer reflective film and the second multilayer reflective film,
    an interlayer insulating film covering at least a circumferential edge, a side portion and a bottom portion of each of the mesa portions, and
    a surface protecting film covering the interlayer insulating film,
    the surface protecting film having a plurality of grooves formed along the predetermined direction of the substrate in which at least a portion of the surface protecting film is removed so that the mesa portions are separated from each other by the plurality of grooves, and each groove is a line extending across the substrate.

2. The VCSEL array device according to claim 1, wherein the grooves are formed to reach the surface protecting film and the interlayer insulating film directly below the surface protecting film.

3. The VCSEL array device according to claim 1, wherein the grooves comprise a slit that runs in a direction orthogonal to the longitudinal direction and has a predetermined length.

4. The VCSEL array device according to claim 1, wherein the number of the grooves is at least n-1 when the number of the mesa portions linearly arranged is n (n is a natural number equal to or greater than 2).

5. The VCSEL array device according to claim 1, wherein the interlayer insulating film is a single inorganic insulating film or stacked layered films made of a plurality of inorganic insulating films of different materials.

6. The VCSEL array device according to claim 1, wherein the surface protecting film is an insulating film of a film material having a normal stress in an opposite direction to the direction of the normal stress in the interlayer insulating film.

7. The VCSEL array device according to claim 1, wherein the interlayer insulating film is made of an inorganic insulating film in which at least one layer thereof comprises aluminum.

8. The VCSEL array device according to claim 1, wherein the interlayer insulating film is stacked layered films made of an inorganic insulating film that comprises aluminum and an inorganic insulating film that comprises silicon.

9. The VCSEL array device according to claim 1, wherein the grooves are filled with an insulating material.

10. The VCSEL array device according to claim 1, wherein the first and second multilayer reflective films are III-V group semiconductor layers that comprise Al, and the selectively oxidized region is a semiconductor layer that comprises Al selectively oxidized from a side surface of the mesa portion.

11. The VCSEL array device according to claim 2, wherein a space including each groove is filled with polyimide.

* * * * *